United States Patent [19]

Kim et al.

[11] Patent Number: 5,716,885
[45] Date of Patent: Feb. 10, 1998

[54] METHOD FOR MANUFACTURING NAND TYPE MASK-ROM HAVING IMPROVED CELL CURRENT

[75] Inventors: Byeung-Chul Kim; Jung-Dal Choi, both of Suwon, Rep. of Korea

[73] Assignee: Samsung Electronics Co., Ltd., Suwon, Rep. of Korea

[21] Appl. No.: 494,845

[22] Filed: Jun. 26, 1995

[30] Foreign Application Priority Data

Jun. 24, 1994 [KR] Rep. of Korea ............... 14657/1994

[51] Int. Cl.⁶ ............................................ H01L 21/8246
[52] U.S. Cl. ........................... 438/275; 438/278; 438/289
[58] Field of Search ..................... 437/40 AS, 41 AS, 437/48, 52, 60, 45; 257/390–391; 438/275, 278, 287

[56] References Cited

U.S. PATENT DOCUMENTS

| | | |
|---|---|---|
| 4,639,892 | 1/1987 | Mizugaki et al. |
| 4,837,181 | 6/1989 | Galbiati et al. ............... 257/391 |
| 5,200,355 | 4/1993 | Choi et al. ................... 437/52 |
| 5,342,798 | 8/1994 | Huang ........................ 437/41 |
| 5,547,888 | 8/1996 | Yamazaki .................... 437/52 |

*Primary Examiner*—Jey Tsai
*Attorney, Agent, or Firm*—Cushman Darby & Cushman IP Group of Pillsbury Madison & Sutro LLP

[57] ABSTRACT

A method for manufacturing a mask-ROM comprises a first process of forming a spacer on a side wall of a gate electrode; a second process of eliminating the spacer disposed on the side wall of the gate electrode of an on-cell; and a third process of doping impurity on the entire surface of a semiconductor substrate formed in the preceding process.

13 Claims, 12 Drawing Sheets

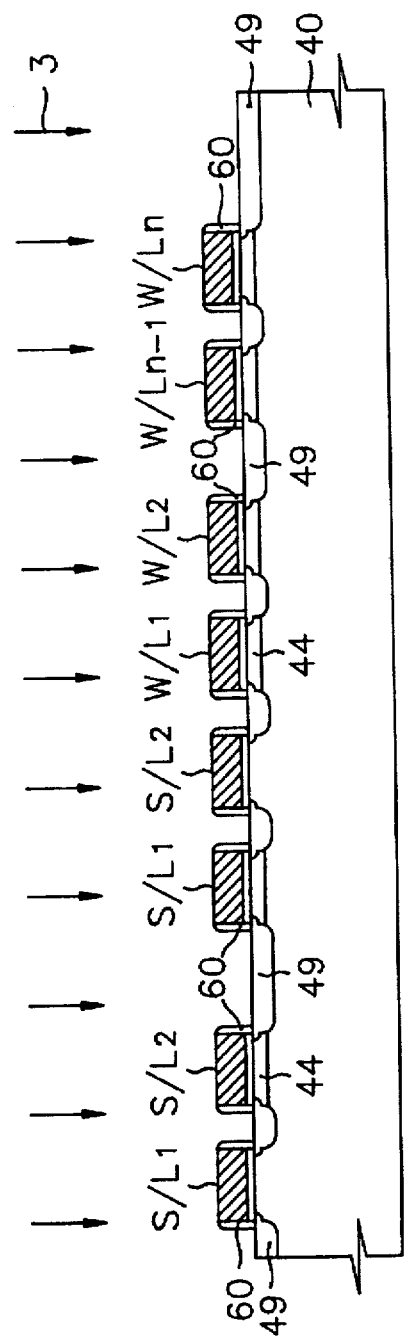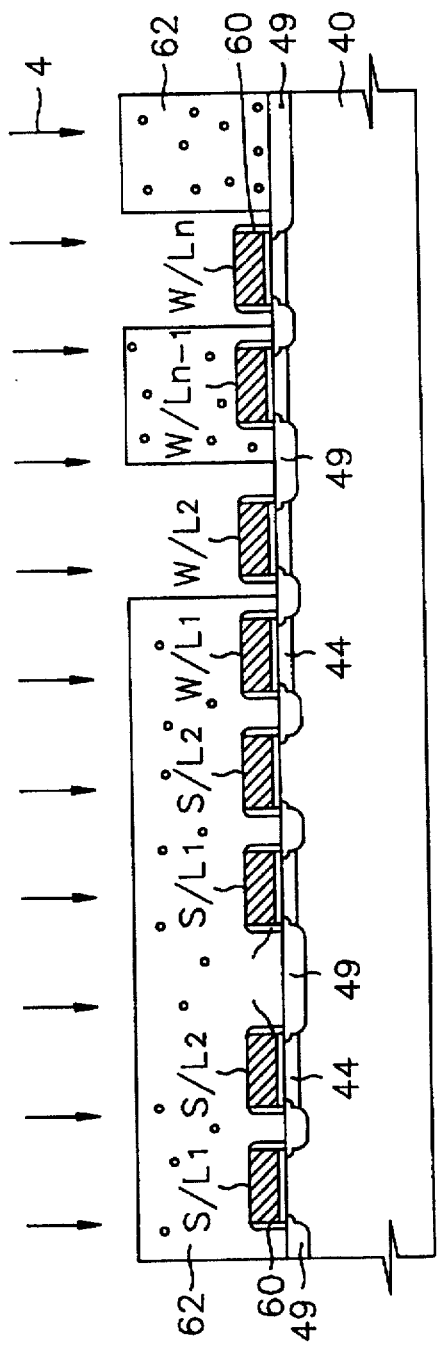

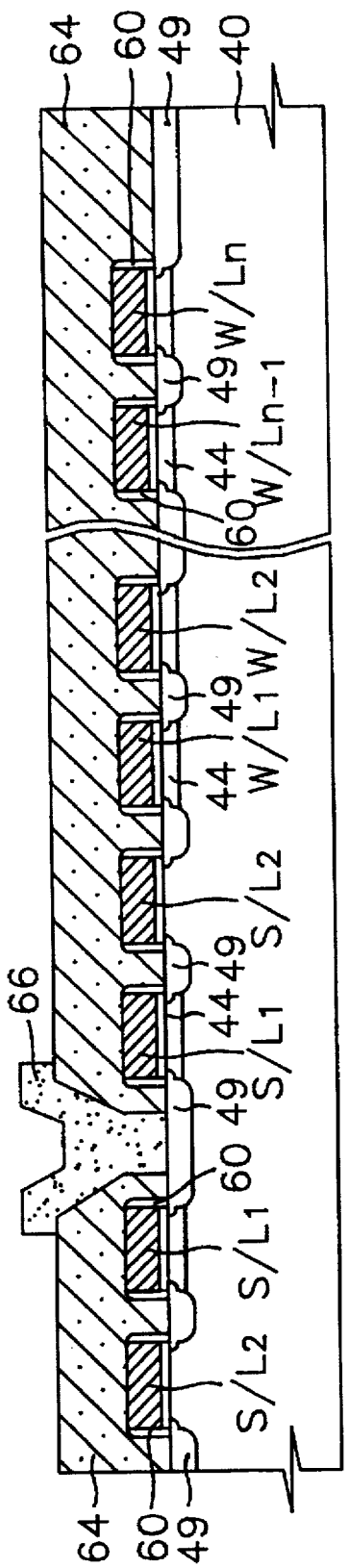
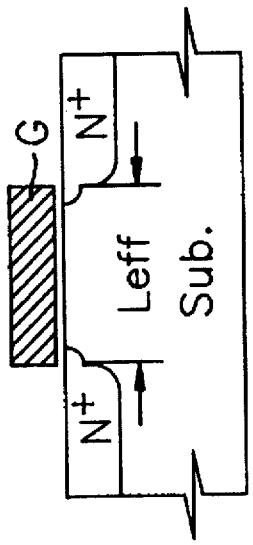
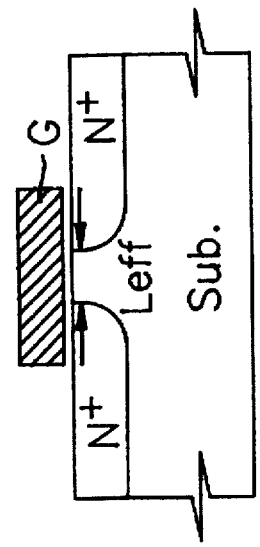
FIG. 3E (PRIOR ART)
FIG. 5A
FIG. 5B

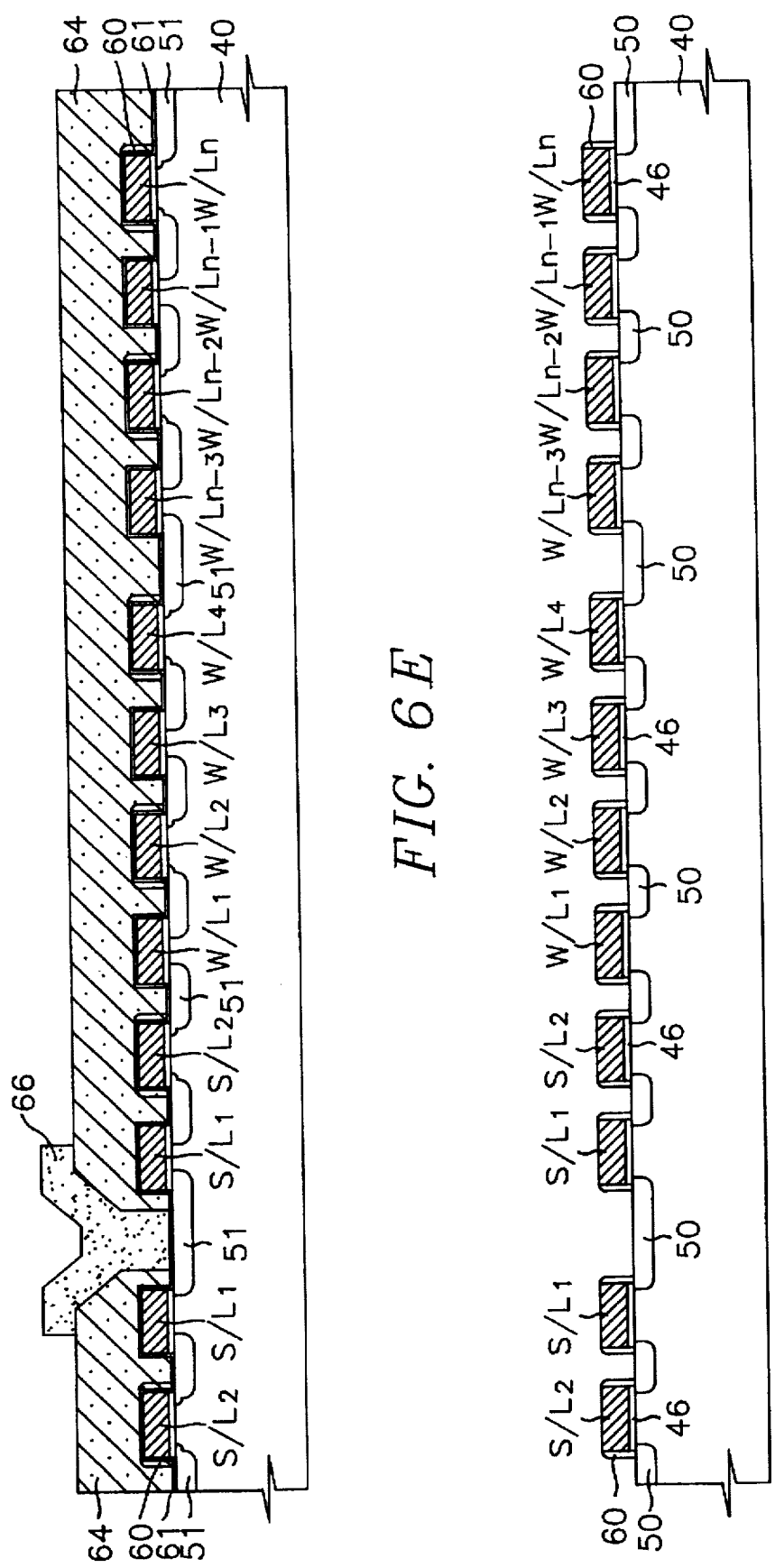

METHOD FOR MANUFACTURING NAND TYPE MASK-ROM HAVING IMPROVED CELL CURRENT

BACKGROUND OF THE INVENTION

The present invention relates to a method for manufacturing a semiconductor memory device, and more particularly to a method for manufacturing a mask-ROM in which the length of an impurity layer (which is expressed as an "N" layer in the present invention) having high thickness in an on-cell transistor is shorter than that of the impurity layer in an off-cell transistor.

The mask-ROM is generally divided into a NOR type mask-ROM and a NAND type mask-ROM. In case of the NOR type mask-ROM, there is provided an advantage of increasing cell current. However, in this case, since the size of a chip becomes large and its process becomes complicated, the NAND type mask-ROM is generally employed instead.

According to the NAND type mask-ROM, there is provided a configuration that a plurality of enhancement type transistors and a plurality of depletion type transistors are serially connected in between a bit line and a ground voltage terminal. Such a cell of a first group is defined as a first string.

FIG. 1 is a view showing an equivalent circuit of a general NAND type mask-ROM.

As shown in FIG. 1, the general NAND type mask-ROM has a plurality of string select cell transistors (M1 and M3: M2 and M4) and a plurality of cell transistors (M5, M7, . . . , $M_{N-1}$: M6, M8, . . . , $M_N$) which use the first and second string select lines S1 and S2 as gate electrodes. The string select cell transistors and cell transistors are serially connected to each other, thereby forming the first and second string lines R1 and R2, respectively. Further, the first and second string lines are parallel connected to the bit line B/L to thereby consist of a basic unit of a memory cell array.

At this time, within one string line, the plurality of enhancement type cell transistors are connected to the plurality of depletion type cell transistors through the impurity layer. In FIG. 1, the cell transistor which is indicated within the dotted line and also indicated as a reference numeral "D", is the depletion type cell transistor and the rest of the transistors are the enhancement type cell transistors.

The operation of the mask-ROM having such an equivalent circuit is as follows.

First, during the stand-by operation, 0 volt is provided to the string select lines S1 and S2 and the common power supply voltage Vcc is provided to the word lines W/L1, W/L2, . . . , $W/L_N$, thereby floating the bit line.

Second, during the read mode operation, 0 volt (or the power supply voltage Vcc) is provided to the first string select line S1 and the power supply voltage Vcc (or 0 volt) is provided to the second string select line S2, thereby selecting the first string line R1 (or the second string line R2). Thereafter, all of the unselected cell transistors of the cell transistors constituting the selected string line are turned on, and 0 volt is applied to the gate electrode of the selected transistor to thereby recognize whether the selected transistor is the enhancement type or the depletion type. This recognition results in reading data stored in the memory cell.

The NAND type mask-ROM has a simple process unlike the NOR type mask-ROM and an advantage capable of reducing the size of the chip. However, as the mask-ROM trends toward high integration density, there is a serious problem in that the cell current is reduced due to the reduction of an active area.

Owing to such reduction of the cell current, a malfunction is performed during reading an "on-cell". Thereby, studies on various cell structures for increasing the cell current and cell program methods are being made.

Recently, there is generally used an AGP (After Gate Program) process of selectively forming the enhancement type transistor by means of the program cell photo after setting the initial states of the all cell transistors to the depletion type transistors.

FIG. 2 is a layout showing a cell array of a prior art NAND type mask-ROM, which is used for performing the AGP process.

In FIG. 2, an area taken along an one dot and dash line is a mask pattern 10 for forming an active area. Areas taken along a long dot line are mask patterns 18 and 29 for forming each word line. An area taken along the real line is a mask pattern 30 for forming a channel area of the depletion type transistor. An area taken along a short dot line is a mask pattern 32 for forming the program cell photo. An area taken along an oblique line is a mask pattern 34 for forming the contact window. Finally, an area taken along two dots and dash line is a mask pattern 36 for forming metal distribution.

FIGS. 3A to 3E are cross sectional views for explaining a manufacturing method of a prior art NAND type mask-ROM, which are taken along the line III—III of FIG. 2.

As shown in FIG. 3A, on a p-type semiconductor substrate 40 which is classified into an active area and an inactive area by means of the mask pattern 10, a photoresist pattern 42 for forming the channel area of the depletion type transistor, is formed by using the mask pattern 30. After this, arsenic ions are ion-implanted on the entire surface of the semiconductor substrate formed in the preceding process under condition of 50 keV–120 KeV, 5.0E12–9.0E12 to thereby form the channel area near to the surface of the semiconductor substrate.

Next, as shown in FIG. 3B, the gate electrode is coated with the gate oxide film 46, i.e., the word lines W/L1 to $W/L_N$, and the string select lines S/L1 and S/L2, are formed by the photo etching technique using the mask patterns 18 and 29. After this, phosphorus ions are ion-implanted 2 into the entire surface of the semiconductor substrate formed in the preceding process under condition of 40 KeV–70 KeV, 1.5E13–3.5E13 to thereby form a source/drain impurity diffusion layer 48 of the cell transistor.

Then, as shown in FIG. 3C, after coating the entire surface of the semiconductor substrate formed in the preceding process with the oxide film, the spacer 60 is formed on the side wall of the word line and the string select line by an anisotropic etching method. Next, arsenic ions are ion-implanted 3 under condition of 40 KeV–70 KeV, 3.0E15–6.0E15 to thereby change the impurity diffusion layer to a configuration 49 LDD (Lightly Doped Drain).

As shown in FIG. 3D, after exposing the off-cell transistor to the formed program cell photo 62 by using the mask pattern 32, boron ions are ion-implanted into the channel area through the gate electrode (in FIG. 3D, W/L2 and $W/L_N$) of the off-cell transistor under condition of 120 KeV–180 KeV, 2.0e13–3.0E13 form each off-cell into made of the enhancement type transistor and the on-cell into the depletion type transistor.

Then, as shown in FIG. 3E, after forming the oxide film 64 on the entire surface of the semiconductor substrate formed in the preceding process, the contact window is formed by the photo etching technique using the mask pattern 34. Further, after depositing conductive material such as aluminum on the entire surface of the semiconductor substrate in which the contact window is formed, the metal distribution 66 is formed by the photo etching technique using the mask pattern 36.

According to the prior art manufacturing method of the mask-ROM, after the initial states of all the cell-transistors are set to the depletion type transistor (which is referred to as FIG. 3A), boron ions are implanted into only the off-cell area through which the gate electrode is passed, thereby making the off-cell to the enhancement type transistor.

However, the mask-ROM manufactured by the above process has some problems.

First, is to diffuse a channel stopper layer of a field oxide film through a process of implanting the boron ions so as to form the enhancement type transistor, the field oxide film classifies the semiconductor substrate into the active and inactive areas. In order to implant the boron ion into the channel area through the gate electrode, there should be a high energy by which the channel stopper layer formed in the lower part of the field oxide film is diffused to the active area, thereby reducing the effective dimension of the active area.

Second, owing to the high threshold voltage $V_{th}$ caused by the boron ion-implantation, the resistance of the active area becomes strong. This results in reducing the cell current. Such a problem becomes more serious depending upon the increasing of the integration density of the mask-ROM.

Hence, in order to form the enhancement type transistor and the depletion type transistor, there is a need to improve the known mask-ROM manufacturing method of ion-implanting through the gate electrode of the cell transistor.

In this aspect, there has been instructed a program method (which is referred to as a U.S. Pat. No. 4,639,892) causing the punch-through of the on-cell transistor by forming the on-cell transistor having the shorter channel length than the off-cell transistor.

The channel of the on-cell transistor is formed to equalize to the width of the gate electrode according to the general method. Also, after forming the more larger mask than the width of the gate electrode on the gate electrode of the off-cell transistor, the channel of the off-cell transistor is formed to be larger than that of the on-cell transistor by performing a process of doping the impurity ion at high energy through the preventing mask for ion-implantation.

However, the invention disclosed in the above U.S. Pat. No. 4,639,892 should have the photo process using a photoresist in order to form the channel of the off-cell transistor. Such a photo process is useful in case that the length of the channel is more than 2 μm. Since in case that the length of the channel is less than 2 μm (still more smaller case is less than 1 μm), there is provided a high probability of generating a mis-align during the photo process. Further, when doping the impurity ion at high energy so as to form the impurity layer of the off-cell transistor, it is difficult to form the off-cell transistor by impurity-implantation at high energy because of the likelihood of generating the punch-through even in the off-cell transistor.

In the semiconductor elements being on the trend of the high integration density, such a mis-align impacts the reliability of the elements. Therefore, it is necessary to have a new process in which the mis-align is not likely generated.

SUMMARY OF THE INVENTION

It is therefore object of the present invention to provide a method for manufacturing a mask-ROM in which the length of an impurity layer having high thickness in an on-cell transistor is shorter than that of the impurity layer in an off-cell transistor.

The object of the present invention is achieved by a manufacturing method having three processes. The first process is to form a spacer on the side wall of a gate electrode. The second process is to eliminate the spacer formed on the side wall of the gate electrode of the on-cell. Further, the third process is to dope impurity on the entire surface of the semiconductor substrate formed in the preceding process.

In one preferred embodiment of the present invention, a process of doping impurity on the resultant objects formed in the gate electrode and forming the impurity layer in between the gate electrodes, should be added prior to performing the first process. Also, another process of doping the impurity on the entire surface of the semiconductor substrate formed in the preceding process, should be added after performing the first process.

In the other preferred embodiment of the present invention, the first process is to form a first material layer on the entire surface of the semiconductor substrate in which the gate electrode is formed by the anisotropic etching technique. At this time, it is possible to add a process of forming a second material layer on the gate electrode prior to performing the process of forming the first material layer.

In another preferred embodiment of the present invention, when the gate electrode is composed of the poly crystallization silicon, the spacer is composed of any one of an oxide film, a nitride film, and the poly crystallization silicon. At the moment, when the spacer is composed of the poly crystallization silicon, a process of eliminating the spacer formed on the side wall of the gate electrode of the off-cell is added after performing the third process.

In the meantime, it is possible to increase a cell current value by purposely generating the punch-through in the on-cell transistor determining the cell current. Further, since the length of the channel is short according to the high integration density, it is easy to generate the punch-through and thus it is easy to integrate the mask-ROM. Furthermore, since it is possible to omit the ion-implantation step for setting the initial state of the cell transistor to the depletion type transistor, the steps of the process according to the present invention can be reduced.

BRIEF DESCRIPTION OF THE DRAWINGS

The above and other objects, advantages and features of the present invention will be more apparent from the following detailed description taken with the attached drawings in which:

FIGS. 3A to 3E are cross sectional views taken along the line III—III of FIG. 2;

FIGS. 5A and 5B are cross sectional views showing on-cells and off-cells manufactured by a manufacturing method according to one embodiment of the present invention;

FIGS. 6A to 6E are cross sectional views for explaining a first embodiment of the present invention, which are taken along the line V—V of FIG. 4;

FIGS. 7A to 7D are cross sectional views for explaining a second embodiment of the present invention, which are taken along the same parts as FIGS. 6A to 6E.

DETAILED DESCRIPTION OF THE PREFERRED EMBODIMENT

Figure 1:
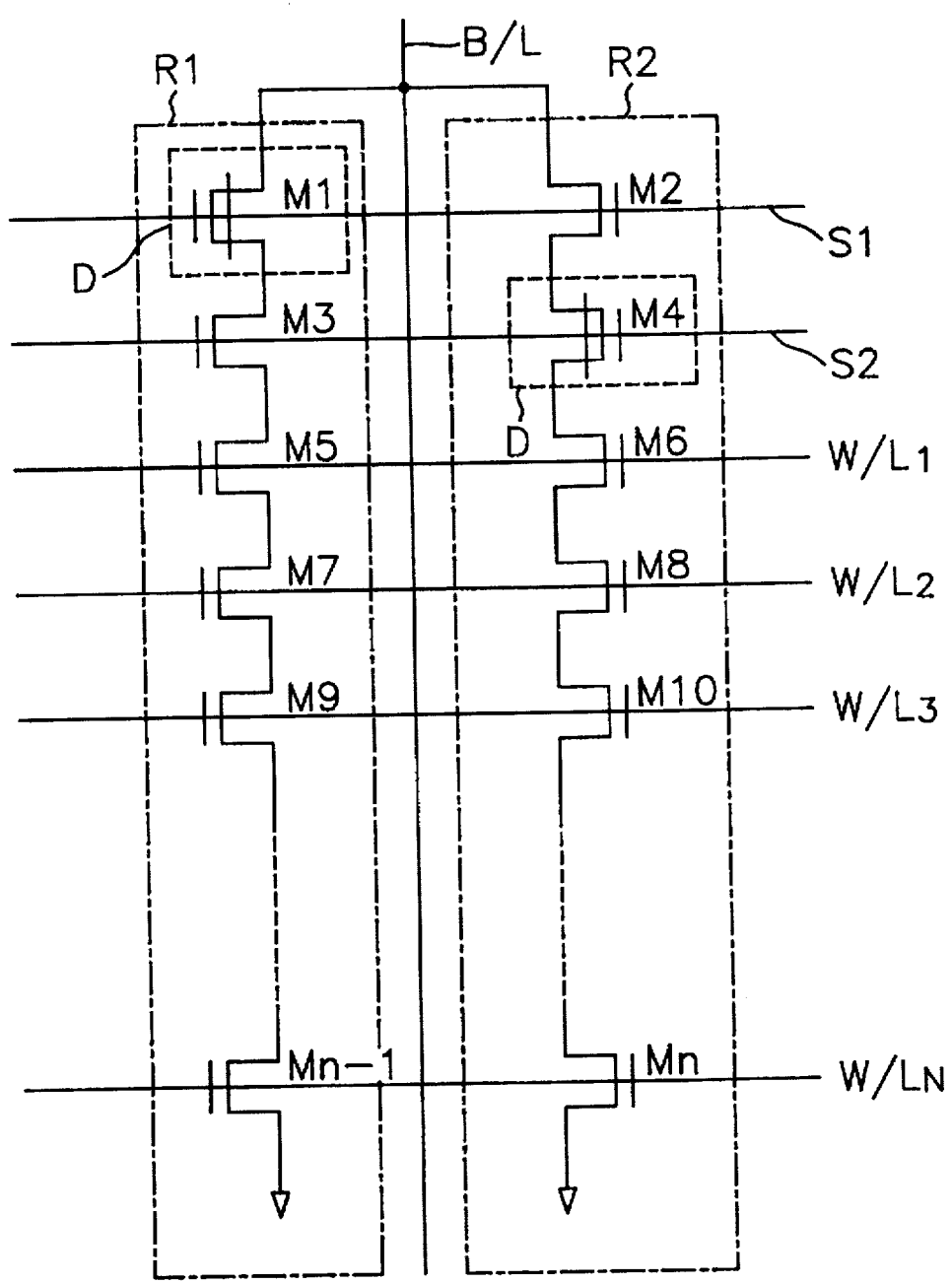
FIG. 1 is an equivalent circuit view showing a general NAND type mask-ROM.

In drawings mentioned hereinafter, the same reference numerals as FIGS. 2, and 3A to 3E indicate the same parts.

Figure 2:
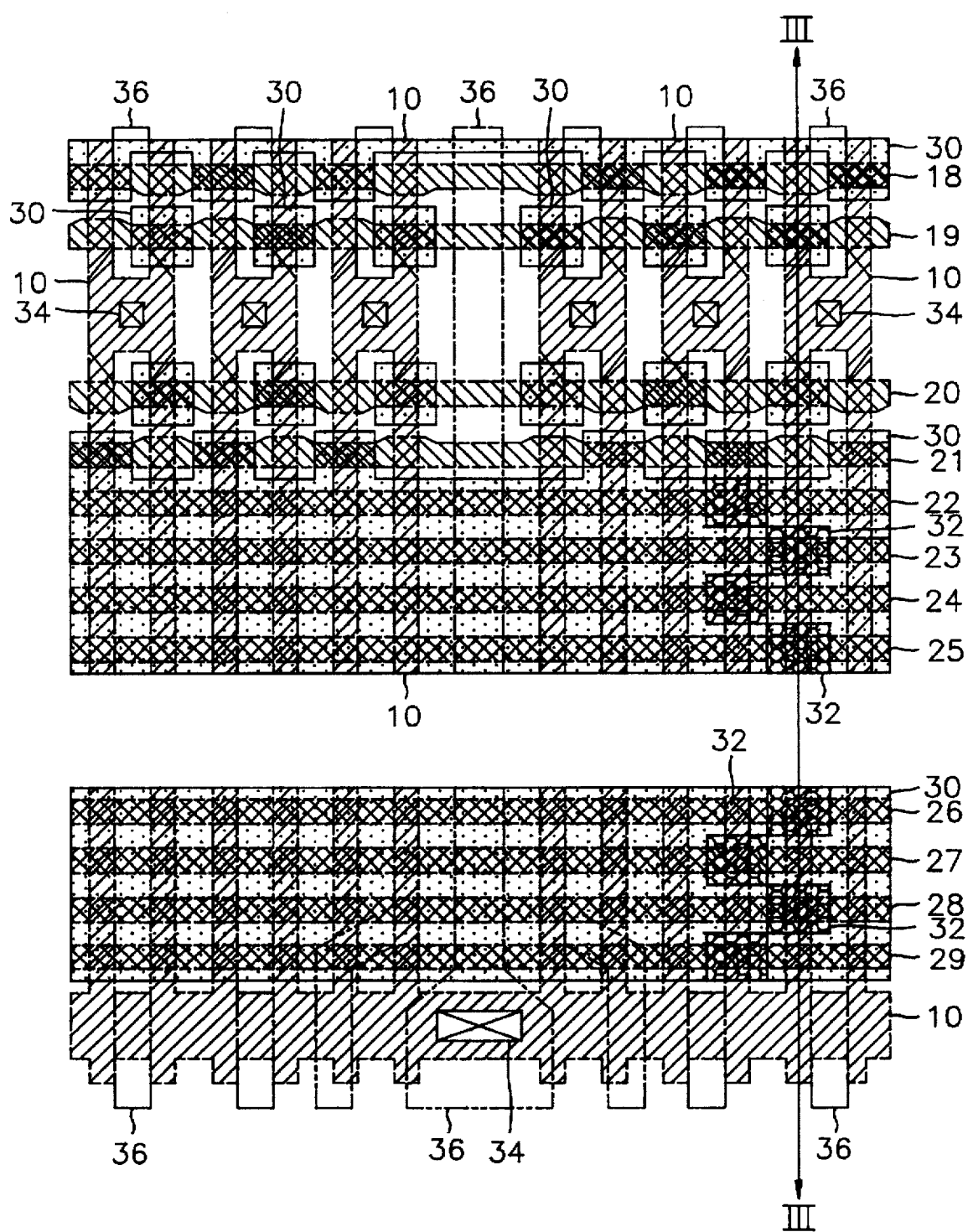
FIG. 2 shows a layout of a cell array of a NAND type mask-ROM according to the prior art.
Figure 3A:
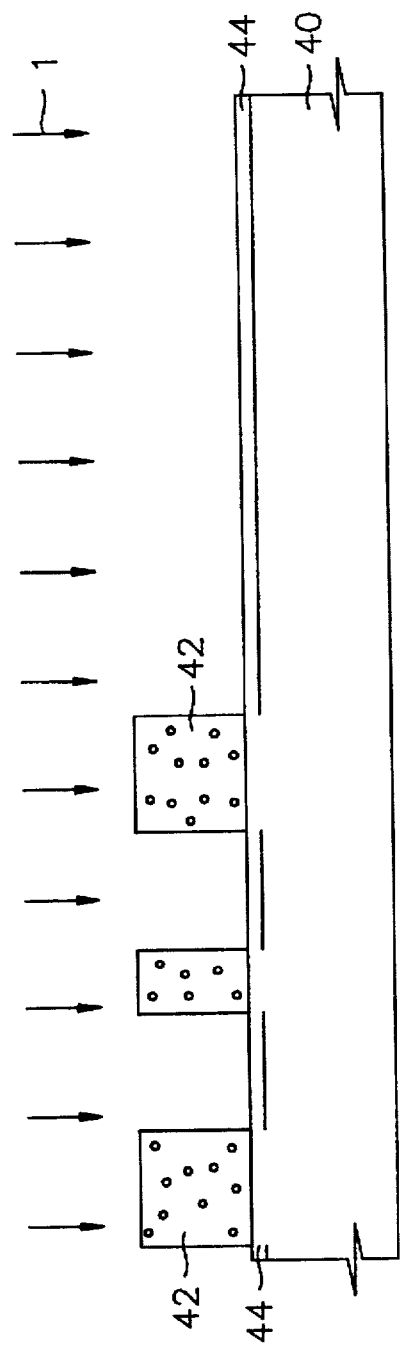
Figure 3B:
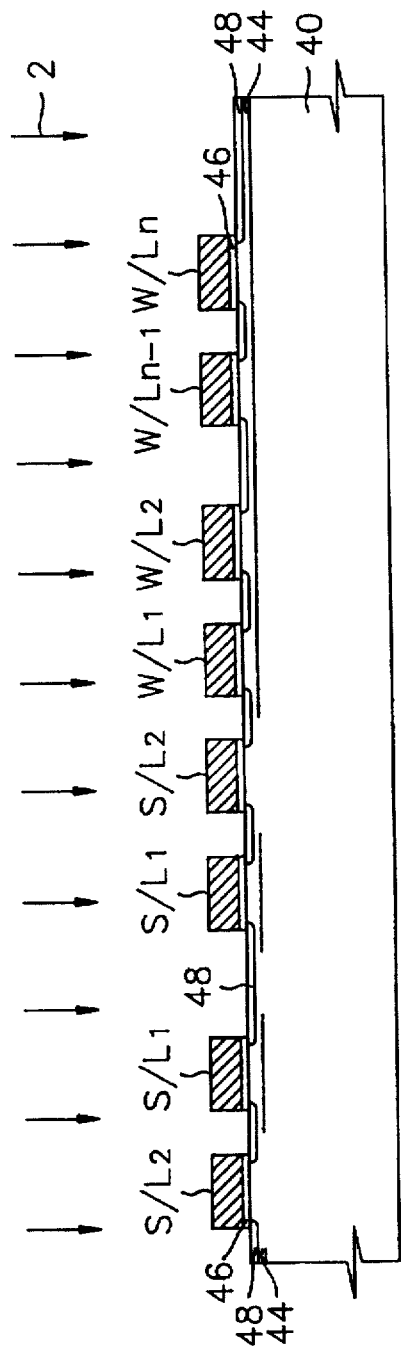
Figure 4:
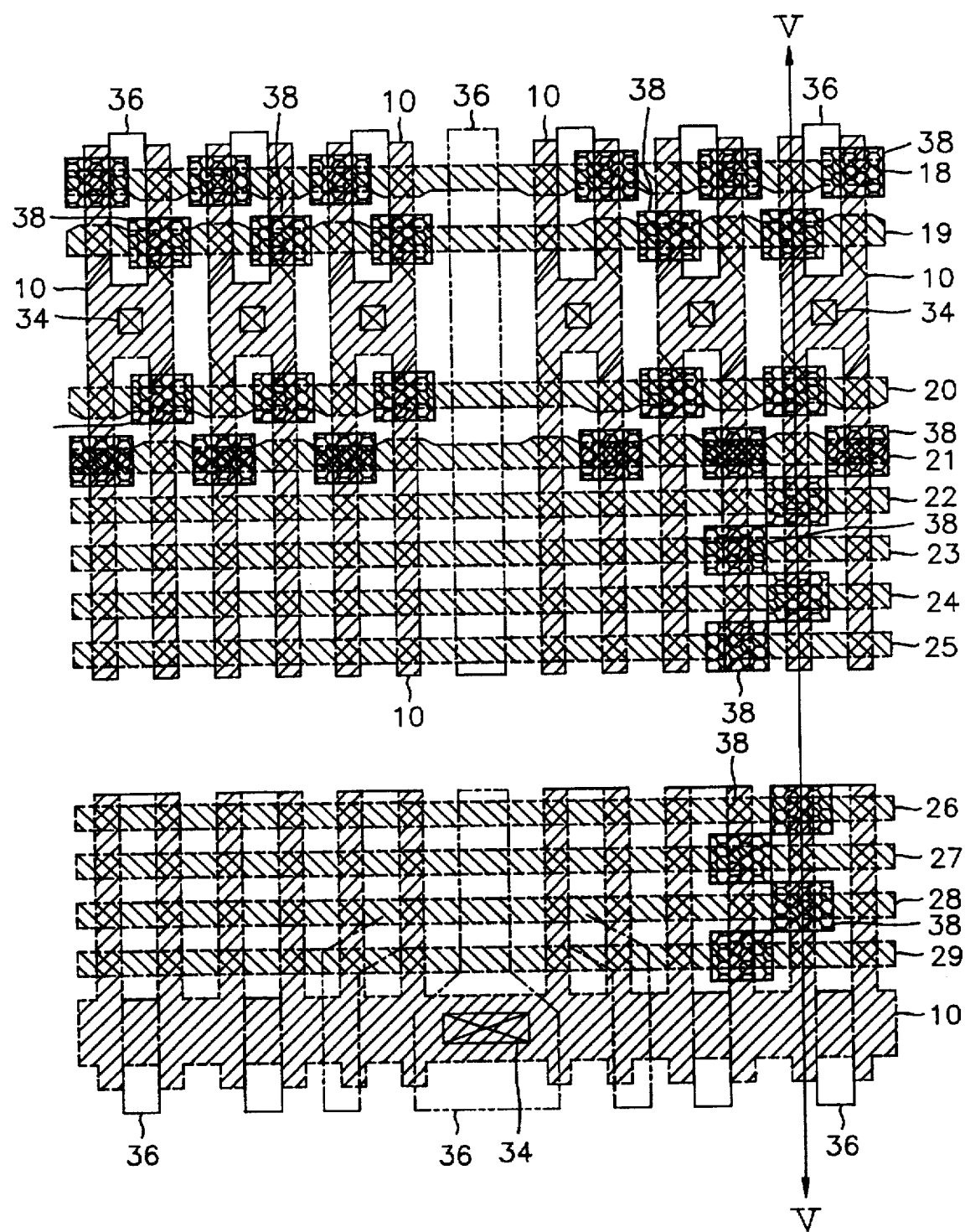
FIG. 4 shows a layout of a cell array of the NAND type mask-ROM according to the present invention.

FIG. 4 shows a layout of a cell array of a NAND type mask-ROM according to the present invention. In case of considering FIG. 2 as a basic view, mask patterns 30 and 32 of FIG. 2 are eliminated and the layout for the other mask pattern 38 for program cell photo is made.

FIGS. 5A and 5B are cross sectional views showing on-cells and off-cells manufactured by a manufacturing method according to one embodiment of the present invention. FIG. 5A shows an on-cell transistor and FIG. 5B shows an off-cell transistor.

As shown, the length $L_{eff}$ between one layer N and the other layer N of the on-cell transistor is shorter than the length between one layer N and the other layer N of the off-cell transistor, so that it is easier to expose the on-cell transistor than the off-cell transistor to a punch-through.

By using the punch-through current of the on-cell transistor as the cell current, it is possible to increase the amount of the cell current. Thereby, a problem, causing the reduction of the cell current in the NAND type mask-ROM can be solved. In FIGS. 5A and 5B, a reference numeral "G" indicates a gate electrode, the other reference numeral "N" a source/drain impurity diffusion layer, and another reference numeral "sub" a semiconductor substrate.

First Embodiment

FIGS. 6A to 6E are cross sectional views for explaining a first embodiment of the present invention, which are taken along the line V—V of FIG. 4.

Figure 6A:
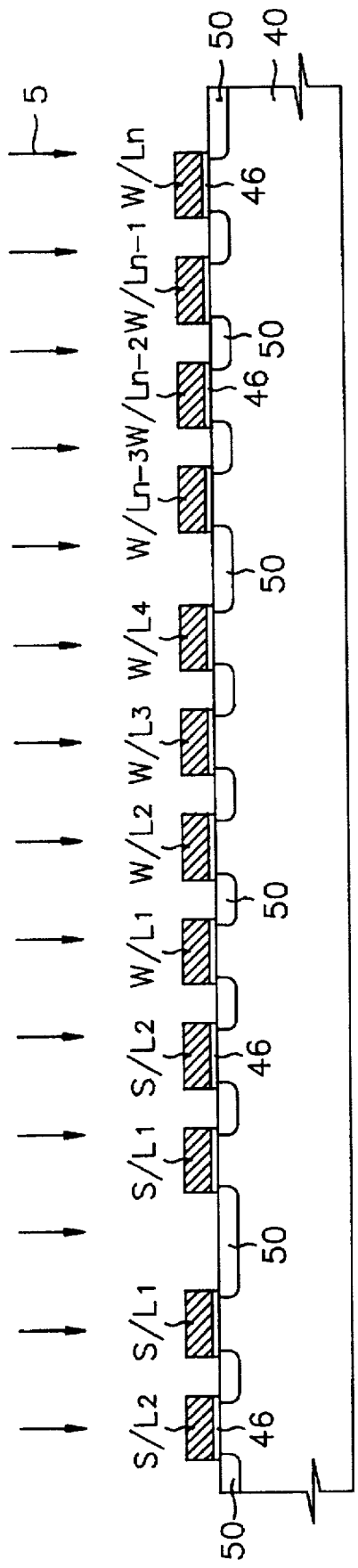

FIG. 6A shows a process of forming word lines W/L$_1$, . . . , W/L$_N$, string select lines S/L$_1$ and S/L$_2$, and the source/drain impurity diffusion layer 50. Further, there are provided three processes in FIG. 6A. The first process is to form a field oxide film (not shown) in an inactive area by using the mask pattern 10 which classifies a P-type semiconductor substrate or a P-type well substrate into the active and inactive areas. After forming a material layer for a gate oxide film and the gate electrode, e.g., poly crystallization silicon layer, on the semiconductor substrate formed in the preceding process, the second process is to form the word lines W/L$_1$ and W/L$_N$ and the string select lines S/L$_1$ and S/L$_2$ by the photo etching technique using the mask patterns 18 and 29. Further, the third process is to form the source/drain impurity diffusion layer 50 on the semiconductor substrate between the lines by phosphorus ion-implantation into the entire surface of the semiconductor substrate formed in the preceding process under a condition of 40 KeV–70 KeV, 1.5E13–3.5E13.

Figure 6B:
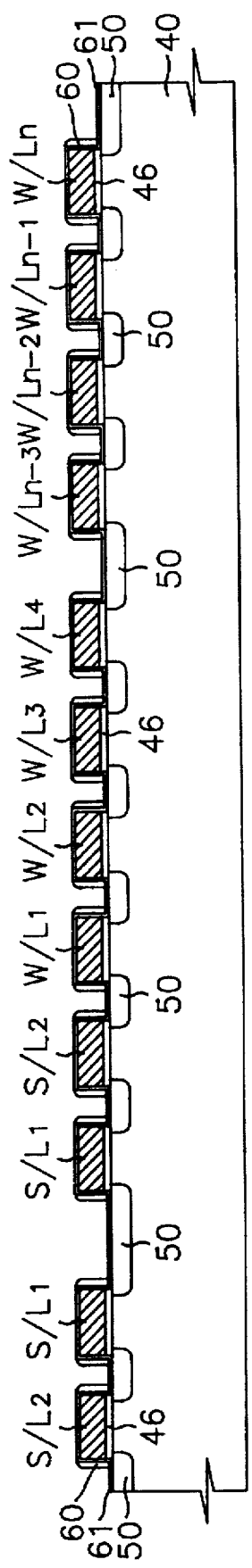

FIG. 6B shows a process of forming a spacer 61. There are provided two processes in FIG. 6B. The first process is to form an etching stopper layer 60 by forming the oxide film or the nitride film to the thickness of about 100 Å–500 Å on the entire surface of the semiconductor substrate in which the impurity diffusion layer 50 is formed. Further, the second process is to form the nitride film, the oxide film, or the poly crystallization silicon film to the thickness of about 1.000 Å–2.000 Å, to thereby form the spacer 61 on the side wall of the word line and the string select line by the anisotropic etching method.

At this time, the material constituting the etching stopper layer is composed of materials having the better etching select rate (for example, with respect to the anisotropic etching method, when the etching rate of the etching stopper layer is 1, that of the material constituting the spacer is at least more than 5), as compared with the material constituting the spacer with respect to the anisotropic etching method.

For example, in case that the oxide film is used as the etching stopper layer, the nitride film or the poly crystallization silicon film is used as the spacer. Further, in case that the nitride film is used as the etching stopper layer, the oxide film or the poly crystallization silicon film is used as the spacer.

Figure 6C:
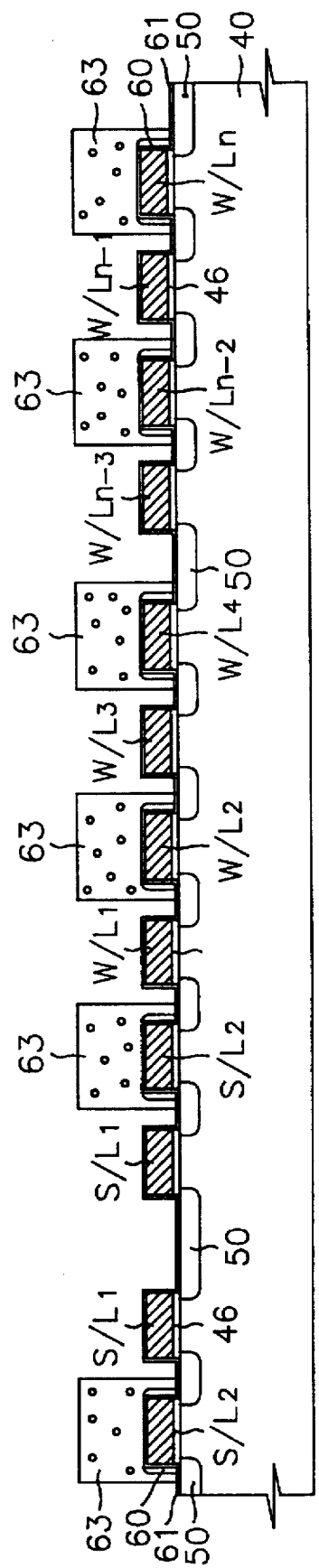

FIG. 6C shows a process of eliminating the spacer formed on the side wall of the gate electrode of the on-cell transistor. There are provided two processes in FIG. 6C. After coating the entire surface of the semiconductor substrate in which the spacer is formed with the photoresist, the first process is to form the program cell photo 63 which exposes the on-cell transistor by performing the photo process using the mask pattern 38. The second process is to eliminate the spacer formed on the side wall of the gate electrode of the on-cell transistor by the anisotropic method.

The program cell photo 63 is formed in the shape of exposing the on-cell transistor to the surface to thereby protect the off-cell transistor. Further, the program cell photo 63 protects the spacer formed on the side wall of the gate electrode of the off-cell transistor with respect to an isotropic etching method.

Figure 6D:
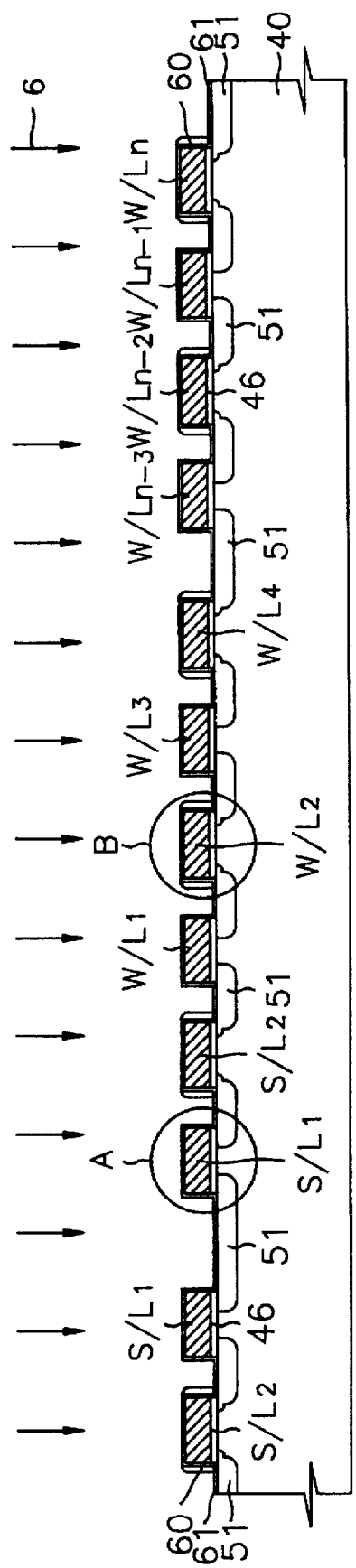

FIG. 6D shows a process of reforming the source/drain impurity diffusion layer 51 of the on-cell and off-cell transistors. There are provided two processes in FIG. 6D. The first process is to eliminate the program cell photo. The second process is to reform the source/drain impurity diffusion layer 51 of the cell transistor by arsenic ion-implantation or phosphorus ion-implantation 6 into the entire surface of the semiconductor substrate formed in the preceding process under condition of 50 KeV–100 KeV, 3.0E15–6.0E15.

At this time, the on-cell transistor from which the spacer is eliminated becomes the prior art transistor by ion-implantation and the off-cell transistor from which the spacer is not eliminated becomes a transistor having a configuration LDD (Lightly Doped Drain). Thus, the length between one layer N and the other layer N of the on-cell transistor is shorter than the length between one layer N and the other layer N of the off-cell transistor, so that it is easy to expose the length therebetween to the punch-through.

FIG. 6E shows a process of forming the metal distribution 66. There are provided three processes in FIG. 6E. The first process is to form a layer insulation film 64 by forming the oxide film on the entire surface of the semiconductor substrate in which the reformed source/drain impurity diffusion layer 51 is formed. The second process is to form the contact window by applying the mask pattern 34 and performing the etching process in consideration of the layer insulation film as the etching objects. And, after depositing the metal material such as aluminum on the entire surface of the semiconductor substrate formed in the preceding process, the third process is to form the metal distribution 66 by performing the etching process to which the mask pattern 36 is applied.

At the moment, in case that the spacer is composed of the poly crystallization silicon prior to performing the first process, a process of eliminating the spacer may be added.

According to the first embodiment of the present invention, the off-cell is formed of a transistor having the configuration LDD, whereas the on-cell is formed of the known transistor, so that the length between one layer N and the other layer N of the on-cell transistor is intended to be shorter than that of the off-cell transistor. This results in increasing the cell current by causing the punch-through of the on-cell transistor. Further, since the photo etching technique for initializing the depletion type transistor and the ion-implantation are not performed as in the prior art, the process according to the present invention can be simply performed. Additionally, since it is unnecessary to perform the ion-implantation in order to form the enhancement type transistor, problems arising upon the diffusion of the channel stopper layer and the increase of the threshold voltage of the transistor do not occur.

Second Embodiment

FIGS. 7A to 7D are cross sectional views for explaining a second embodiment of the present invention, which are taken along the same parts as FIGS. 6A to 6E.

Figure 7B:
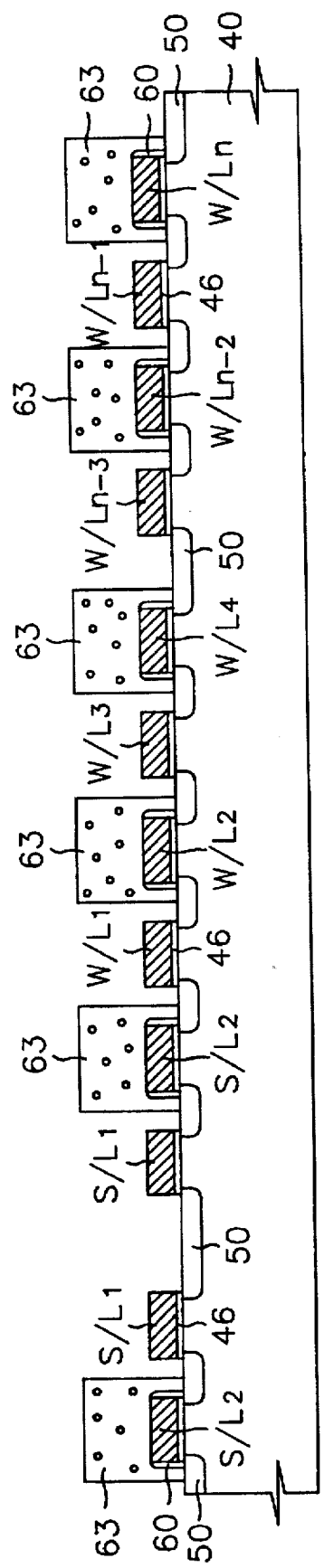
Figure 7C:
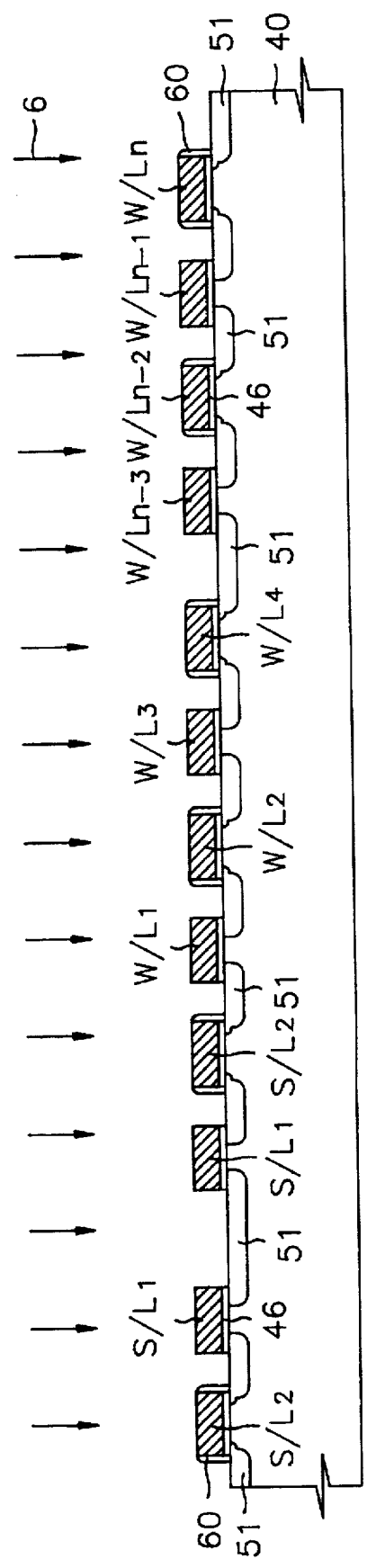
Figure 7D:
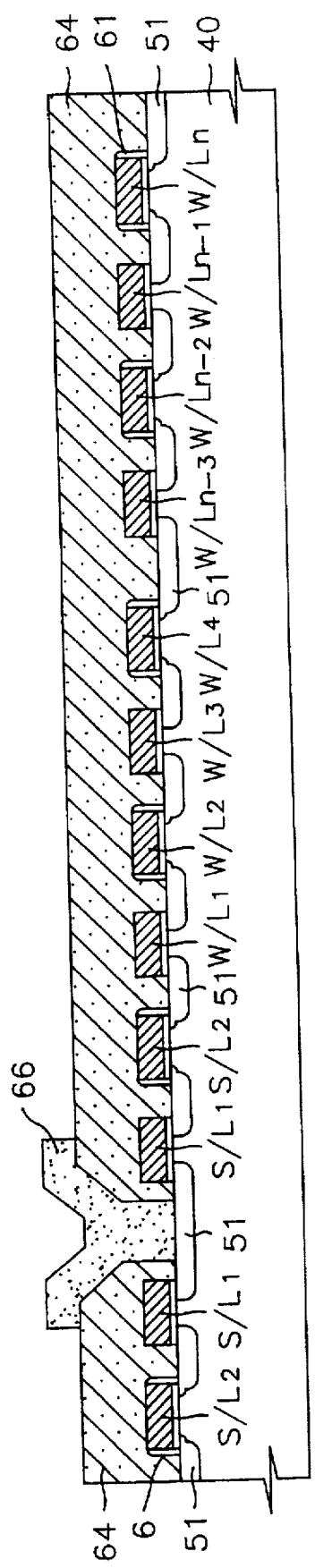

As shown in FIG. 7A, since the field oxide film is formed up to the source/drain impurity diffusion layer 50 of the cell transistor through the same process as that of FIG. 6A, and also the oxide film, the nitride film, or the poly crystallization silicon is formed in a state that the etching stopper layer (which is referred to as FIG. 6B) is not formed, the spacer 61 is formed by the anisotropic etching method. At this time, the surface of the gate electrode or the surface of the semiconductor substrate functions as the etching stopper with respect to the anisotropic etching method. Next, the processes of FIGS. 7B, 7C, and 7D are equally performed to those of FIGS. 6C, 6D, and 6E.

According to the second embodiment of the present invention, it is possible to reduce the process of forming the etching stopper layer by using the surface of the gate electrode or the surface of the semiconductor substrate as the etching stopper without forming the etching stopper layer 60, even if the etching stopper layer 60 is formed in the first embodiment thereof. Thereby, the precess according to the present invention can be simply performed.

Third Embodiment

Figure 8A:
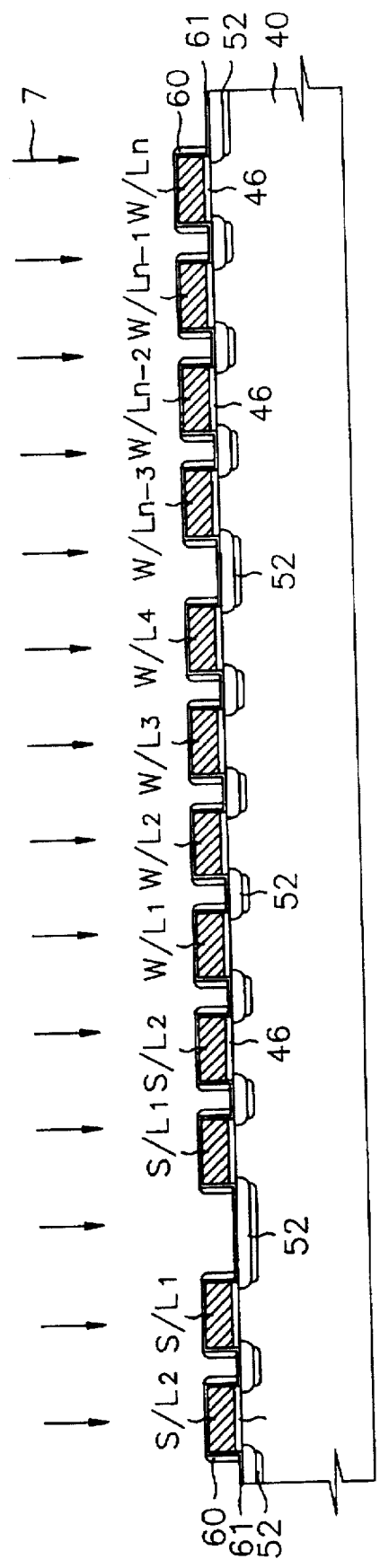
FIGS. 8A to 8C are cross sectional views for explaining a third embodiment of the present invention, which are taken along the same parts as FIGS. 6A to 6E.
Figure 8B:
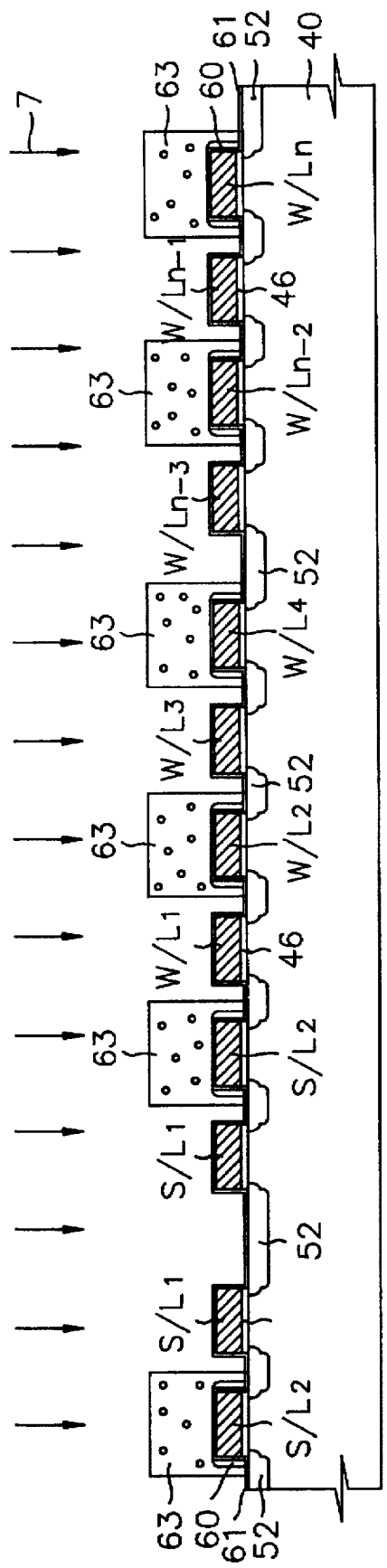
Figure 8C:
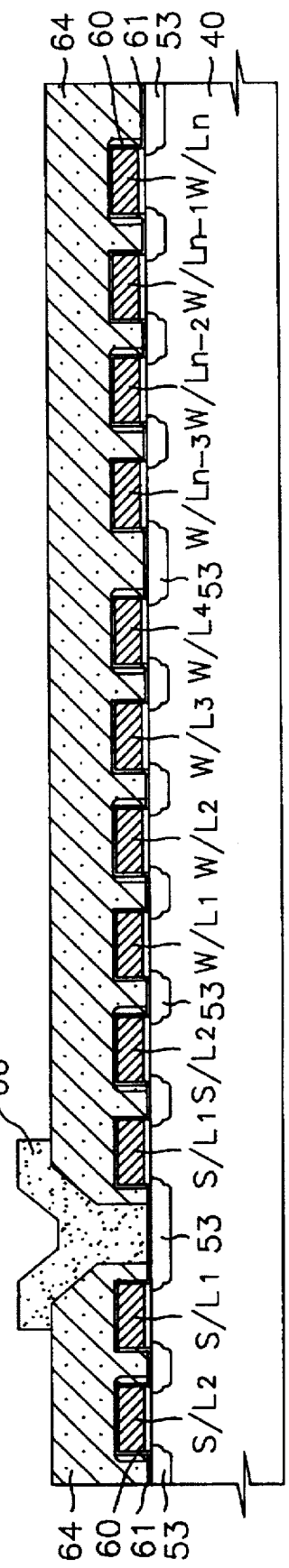

FIGS. 8A to 8C are cross sectional views for explaining a third embodiment of the present invention, which are taken along the same parts as FIGS. 6A to 6E.

As shown in FIG. 8A, after the field oxide film is formed up to the spacer 61 through the same processes as those of FIGS. 6A and 6B, the source/drain impurity diffusion layer 52 is formed like the configuration LDD by arsenic ion-implantation or phosphorus ion-implantation into the entire surface of the semiconductor substrate formed in the preceding process under condition of 50 KeV–100 KeV, 3.0E15–6.0E15. Then, as shown in FIG. 6C, after the spacer formed on the side wall of the gate electrode of the on-cell transistor is eliminated by the isotropic etching method, the arsenic ions or the phosphorus ions are additionally implanted into only the on-cell transistor under a condition of 60 KeV–150 KeV, 2.0E13–1.0E14. Thereafter, the rest of processes are equally performed to that of FIG. 6E.

Therefore, according to the mask-ROM and the method for manufacturing the same in accordance with the present invention, the off-cell transistor is formed as the configuration LDD and the on-cell transistor is also formed as the prior art configuration. Thus, the length between one layer N and the other layer N of the on-cell transistor is shorter than that of the off-cell transistor. Thereby, it is possible to increase the cell current by causing the punch-through of the on-cell transistor and it is also possible to simplify the step of the process because in the present invention the process is simply performed, unlike the prior method. Further, according to the present invention, since the ion-implantation step is eliminated at high temperature, the channel stopper layer is not diffused and the threshold voltage is not increased. This results in improving the reliability of the mask-ROM. Furthermore, as the integration density becomes higher, the length of the channel becomes short. Therefore, the length according to the present invention is advantageous to the high integration density.

Accordingly, various modifications may be made without departing from the spirit or scope of the general inventive concept as defined by the appended claims and their equivalents.

What is claimed is:

1. A method for manufacturing a mask-ROM comprising:
    a first process of forming a spacer on a side wall of a gate electrode, said gate electrode being associated with one of an on-cell and an off-cell;
    a second process of eliminating said spacer when said gate electrode is associated with said on-cell and preserving said spacer when said gate electrode is associated with said off-cell; and
    a third process of doping a first conductive impurity on the entire surface of a semiconductor substrate formed in said second process, said third process being carried out such that when said gate electrode is associated with said off-cell, said off-cell is constituted by a first transistor having a lightly-doped drain structure, and when said gate electrode is associated with said on-cell, said on-cell is constituted by a second transistor having an effective channel length less than that of said first transistor.

2. A method for manufacturing a mask-ROM as claimed in claim 1, further comprising, prior to said first process, a process of forming an impurity layers adjacent to said gate electrode by doping a second conductive impurity on the entire surface of said semiconductor substrate in which said gate electrode is formed.

3. A method for manufacturing a mask-ROM as claimed in claim 2, further comprising, after said first process, a process of doping a third conductive impurity on the entire surface of said semiconductor substrate formed in said first process.

4. A method for manufacturing a mask-ROM as claimed in claim 3, wherein said process of doping said third conductive impurity is performed on only a portion of said semiconductor substrate associated with said on-cell.

5. A method for manufacturing a mask-ROM as claimed in claim 1, wherein said first process includes:
    forming a first material layer on the entire surface of said semiconductor substrate where said gate electrode is formed; and
    etching said first material by an anisotropic etching technique.

6. A method for manufacturing a mask-ROM as claimed in claim 5, wherein said first process further comprises a step of forming a second material layer on said gate electrode, prior to said step of forming said first material layer.

7. A method for manufacturing a mask-ROM as claimed in claim 6, wherein said second material layer is composed of any one of an oxide film and a nitride film.

8. A method for manufacturing a mask-ROM as claimed in claim 1, wherein said spacer is composed of any one of an oxide film, a nitride film, and poly crystallization silicon when said gate electrode is composed of poly crystallization silicon.

9. A method for manufacturing a mask-ROM as claimed in claim 8, further comprising a process of eliminating said spacer when said gate electrode is associated with an off-cell after said third process when said spacer is composed of said poly crystallization silicon.

10. A method for manufacturing a mask-ROM as claimed in claim 1, wherein said first and second transistors are both depletion mode transistors.

11. A method for manufacturing a mask-ROM comprising:

forming a plurality of source/drain regions in a semiconductor substrate;

forming a plurality of gate electrodes on said semiconductor substrate respectively disposed between said plurality of source/drain regions;

forming spacers on side walls of said plurality of gate electrodes;

selectively removing spacers from side walls of certain of said plurality of gate electrodes associated with on-cells while preserving spacers formed on side walls of others of said plurality of gate electrodes associated with off-cells; and doping a conductive impurity on said semiconductor substrate after said step of selectively removing spacers, said doping step being performed such that said off-cells are each constituted by a first transistor having a lightly-doped drain structure, and said on-cells are each constituted by a second transistor having an effective channel length less than that of said first transistor.

12. A method according to claim 11, wherein said doping step is performed only on portions of said substrate corresponding to said certain of said plurality of gate electrodes associated with on-cells.

13. A method for manufacturing a mask-ROM as claimed in claim 12, wherein said first and second transistors are both depletion mode transistors.

* * * * *